United States Patent [19]

Sata

[11] Patent Number: 5,343,707
[45] Date of Patent: Sep. 6, 1994

[54] METHODS AND APPARATUS FOR REMOVING CYCLIC NOISE FROM THE OUTPUT SIGNAL OF A MAGNETIC SENSOR

[75] Inventor: Ken-ichi Sata, Tsukuba, Japan

[73] Assignee: Daikin Industries, Ltd., Osaka, Japan

[21] Appl. No.: 71,004

[22] Filed: Jun. 4, 1993

[30] Foreign Application Priority Data

Jun. 29, 1992 [JP] Japan .................. 4-170538

[51] Int. Cl.$^5$ ............................................. F25B 9/00
[52] U.S. Cl. .......................................... 62/6; 62/49.1; 324/248
[58] Field of Search ............... 324/248; 62/6, 49.1; 128/653.1

[56] References Cited

U.S. PATENT DOCUMENTS

| | | | |
|---|---|---|---|
| 4,996,479 | 2/1991 | Hoenig .............................. | 62/49.1 X |
| 5,152,288 | 10/1992 | Hoenig et al. ..................... | 324/248 X |
| 5,173,659 | 12/1992 | Chiba et al. ...................... | 324/248 X |
| 5,193,348 | 3/1993 | Schnapper ........................ | 324/248 X |

FOREIGN PATENT DOCUMENTS 2-302680 12/1990 Japan .

OTHER PUBLICATIONS

Yoshida, T., et al., "MCG Measurements with a Squid cooled by a Cryocooler", published on Jun. 5, 1992 for a Japanese academy society related to the study of the body and magnetism, in vol. 5, No. 1 of a collection of articles by the society.
Sata, K., et al. "Biomagnetic Measurements with a SQUID cooled by a GM/JT Cryocooler" for Daikin Industries, Ltd. Aug. 1991.
Kang, Myung-Yoon et al., "4 K GM/JT Cryocooler for Cryogenic Sensors" for Daikin Industries, Ltd. Oct. 25, 1990.
Sata, Ken-ichi et al., "Study of SQUID Cooling by GM/JT Cryocooler" is identified as article B3-15 Dec. 1989.
Sata, Ken-ichi et al., "Study of SQUID Cooling by GM/JT Crycooler" is identified as article D2-17 Nov. 1990.
Sata, Ken-ichi et al., "Study of SQUID Cooling by GM/JT Cryocooler" is identified as article E1-18.

*Primary Examiner*—William E. Wayner
*Attorney, Agent, or Firm*—Beveridge, DeGrandi, Weilacher & Young

[57] ABSTRACT

A cyclic noise removing method first generates a template of a cyclic noise caused by a cryogenic refrigerator, which template is generated by arithmetically averaging the output signal from a magnetic sensor by every vibration cycle of the cryogenic refrigerator, the magnetic sensor being cooled by the cryogenic refrigerator, then removes noise included in the output signal of the magnetic sensor by subtracting the template from the output signal of the magnetic sensor.

14 Claims, 13 Drawing Sheets

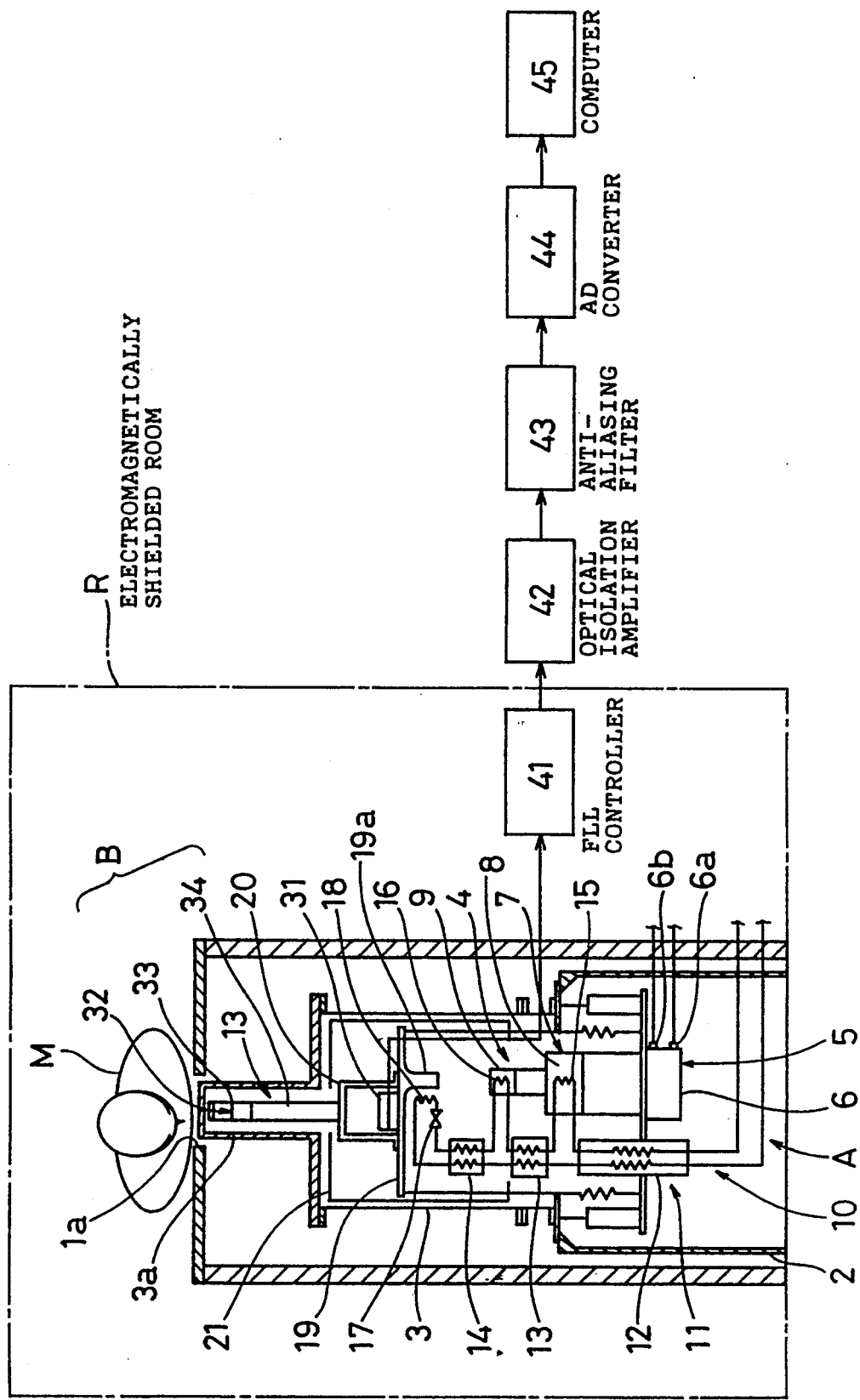

Fig 4A
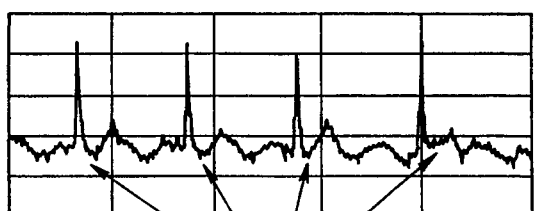

Fig.4D
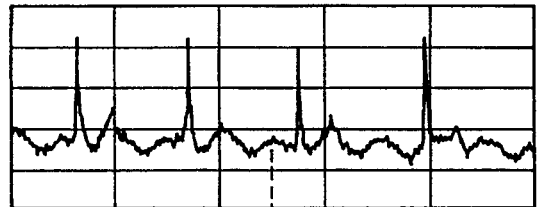
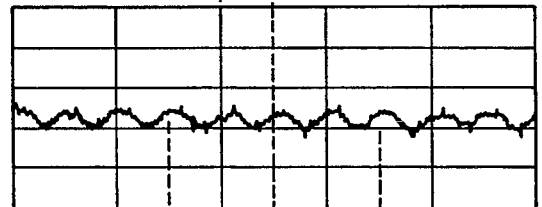
Fig.4E

METHODS AND APPARATUS FOR REMOVING CYCLIC NOISE FROM THE OUTPUT SIGNAL OF A MAGNETIC SENSOR

BACKGROUND OF THE INVENTION

The present invention relates to methods and apparatus for removing cyclic noise caused by vibration of a cryogenic refrigerator when a magnetic sensor is cooled by the cryogenic refrigerator, the magnetic sensor being a superconductive quantum interference device (hereinafter referred to as SQUID) magnetic sensor including a SQUID which is in a superconductive state under a cryogenic temperature level, and the like.

In the past, a SQUID utilizing the Josephson effect has been a known superconductive device. When magnetic flux input circuitry including a superconductive pick up coil is interconnected to the SQUID, a SQUID gradiometer (a magnetic sensor based on a SQUID) is obtained, which can measure extremely weak magnetic field such as magnetic field caused by small currents flowing in a living organism, magnetic field caused by micro magnetic substances in a living organism, and the like.

When a SQUID gradiometer is to be cooled to a cryogenic temperature level, that is a temperature level for transiting a SQUID and a superconductive coil to superconductive state, a method is known which stores liquid helium at the cryogenic temperature level in a helium liquefied temperature insulated casing (cryostat), then dips the SQUID gradiometer in the liquid helium. When this method is employed, a refrigerating device of a cryogenic refrigerator for generating cold temperature is usually housed in the helium liquefied temperature insulated casing so as to condense and liquefy the helium gas which is vaporised in the helium liquefied temperature insulated casing.

When this method is employed, a SQUID gradiometer is cooled rapidly and stable for the entire extent of the SQUID gradiometer because the SQUID gradiometer is dipped in liquid helium. But, disadvantages arise in that the cooling system for cooling a SQUID gradiometer becomes large in size, and that operability of the cooling system is lowered because helium is housed in the helium liquefied temperature insulated casing for cooling a SQUID gradiometer. By taking these disadvantages into consideration, a new method has received attention, which cools a SQUID gradiometer by contacting the SQUID gradiometer with a refrigerating device of a cryogenic refrigerator in a direct heat transferrable manner (refer to Japanese Patent Laid Open Hei 2-302680).

When this new method is employed, the cryogenic refrigerator includes some sections which vibrate when the cryogenic refrigerator is driven, and it is very difficult to remove the vibration entirely. A disadvantage arises in that the noise caused by the vibration of the cryogenic refrigerator contaminates the output signal of a SQUID gradiometer so as to make the output signal inaccurate in original signal detection of the SQUID gradiometer.

The disadvantage can be dissolved by employing two channels in the signal system of the SQUID gradiometer, one channel being used for usual measurement, the other channel being used for measuring the noise caused by the vibration of a cryogenic refrigerator, and by comparing both measurement signals. A new disadvantage arises in that the number of channels of the signal system increases.

This disadvantage can also be dissolved by employing one channel of the signal system of a SQUID gradiometer and by taking the ususal measurements, and then measuring the noise caused by the vibration of the cryogenic refrigerator, and thereafter comparing both measurement signals. A new disadvantage arises in that accurate detection of the original signal is difficult because the measurement timings are quite different from one another, causing inevitably varying vibration characteristics of the cryogenic refrigerator.

When a magnetic sensor other than a SQUID gradiometer is employed, similar disadvantages to those above-mentioned arise when the magnetic sensor measures flux under a cooled condition from a cryogenic refrigerator.

SUMMARY OF THE INVENTION

It is an object of the present invention to detect a cyclic noise caused by the vibration of a cryogenic refrigerator and to remove the detected cyclic noise from the output signal of a magnetic sensor.

It is another object of the present invention to remove a cyclic noise caused by the vibration of a cryogenic refrigerator from the output signal of a magnetic sensor without need of corrective action for vibration isolation to the cryogenic refrigerator, complicated hardware and software.

It is a further object of the present invention to remove a cyclic noise caused by the vibration of a cryogenic refrigerator from the output signal of a magnetic sensor even when a signal cycle corresponding to an object for measurement is similar to a vibration cycle of a cryogenic refrigerator.

A method for removing cyclic noise from the output of a magnetic sensor comprises the steps of;

arithmetically averaging the output of a magnetic sensor for every integral fundamental period of noise caused by vibration of a refrigerator so as to generate a template of a cyclic noise, the template substantially omitting the object signal for measurement and other noise; and subtracting the template from the output of the magnetic sensor so as to obtain the object signal.

When this method is employed, the levels of the object signal and other noise are lowered, while the level of the cyclic noise caused by the vibration of the refrigerator is scarcely lowered by arithmetically averaging the output signal of the magnetic sensor for every integral fundamental period of noise caused by the vibration of the refrigerator. The template of the cyclic noise caused by the vibration of the refrigerator is accordingly obtained. Then, the object signal is obtained by subtracting the template from the output of the magnetic sensor. No corrective action for vibration isolation to the refrigerator is needed because the template of the cyclic noise can be generated based upon only the output of the magnetic sensor and the cyclic noise can be removed by only subtracting the template from the output of the magnetic sensor. The entire arrangement of a magnetic field measurement system can be simplified because the number of channels of signal system may sufficiently be one and the sufficient number of times for measurement may also be only one.

It is preferable that the output signal is phase matched when the output of the magnetic sensor is added. When this method is employed, periods of the template are accurately matched to periods of the cyclic noise caused by vibration of the refrigerator so as to remove the cyclic noise from the output of the magnetic sensor accurately even when the vibration period of the refrigerator varies.

It is also preferable that data obtained by subtracting the averaged object signal from the output of the magnetic sensor is used to generate the template of the cyclic noise. When this method is employed, the influence of the object signal which is included in the template of the cyclic noise can be suppressed so as to remarkably surpress waveform distortion of a signal which is obtained by removal of the cyclic noise from the output of the magnetic sensor.

A method for removing cyclic noise from the output of a magnetic sensor according to the present invention comprises the steps of;

(a) arithmetically averaging an object signal by employing the object signal as trigger signals so as to obtain arithmetically averaged signal prior to actual measurement;

(b) performing actual measurement so as to obtain the output of a magnetic sensor, and subtracting the arithmetically averaged signal from the output so as to obtain a difference signal;

(c) arithmetically averaging the difference signal for a predetermined number of prior cycles so as to obtain an averaged noise signal, the prior cycles being determined with respect to a position corresponding to a portion of the output signal, which portion is to have its cyclic noise removed;

(d) subtracting the averaged noise signal from the portion of the output signal; and (e) repeating the processings in steps (c) and (d) when the output signal is obtained for every new cycle.

When this method is employed, cyclic noise can be removed when the output signal is obtained for every new cycle. Therefore, real time processing for removing cyclic noise can be carried out.

An apparatus for removing cyclic noise from the output of a magnetic sensor according to the present invention comprises;

noise template generating means for generating a template of cyclic noise excluding the object signal for measurement and other noise by arithmetically averaging the output of a magnetic sensor for every integral fundamental period of noise caused by vibration of a refrigerator; and cyclic noise removing means for obtaining an object signal by subtracting the template from the output of the magnetic sensor.

When this apparatus is employed, the levels of the object signal and other noise are lowered, while the level of the cyclic noise caused by the vibration of the refrigerator is scarcely lowered, by arithmetically averaging the output signal of the magnetic sensor for every integral fundamental period of noise caused by the vibration of the refrigerator. The template of the cyclic noise caused by the vibration of the refrigerator is accordingly obtained. Then, the object signal is obtained by subtracting the template from the output of the magnetic sensor. No corrective action for vibration isolation to the refrigerator is needed because the template of the cyclic noise can be generated based upon only the output of the magnetic sensor and the cyclic noise can be removed by only subtracting the template from the output of the magnetic sensor. The entire arrangement of a magnetic field measurement system can be simplified because the number of channels of signal system may sufficiently be one and a sufficient number of times for measurement may also be only one.

It is preferable that the output signal is phase matched when the output of the magnetic sensor is added. When this method is employed, the periods of the template are accurately matched to periods of the cyclic noise caused by the vibration of the refrigerator so as to remove the cyclic noise from the output of the magnetic sensor accurately even when the vibration period of the refrigerator varies.

It is also preferable that data obtained by subtracting the averaged object signal from the output of the magnetic sensor is used to generate the template of the cyclic noise. When this method is employed, the influence of the object signal which is included in the template of the cyclic noise can be surpressed so as to remarkably surpress waveform distortion of a signal which is obtained by removal of the cyclic noise from the output of the magnetic sensor.

An apparatus for removing cyclic noise from the output of a magnetic sensor according to the present invention comprises;

first arithmetically averaging means for arithmetically averaging an object signal by employing the object signal as trigger signals so as to obtain an arithmetically averaged signal prior to actual measurement;

first subtracting means for performing actual measurement so as to obtain the output of a magnetic sensor, and for subtracting the arithmetically averaged signal from the output so as to obtain a difference signal;

second arithmetically averaging means for arithmetically averaging the difference signal for a predetermined number of prior cycles so as to obtain an averaged noise signal, the prior cycles being determined with respect to a position corresponding to a portion of the output signal, which portion is to have its cyclic noise removed;

second subtracting means for subtracting the averaged noise signal from the portion of the output signal; and repetition control means for repeating processings of the second arithmetically averaging means and the second subtracting means when the output signal is obtained for every new cycle.

When this apparatus is employed, cyclic noise can be removed when the output signal is obtained for every new cycle. Therefore, real time processing for removing cyclic noise can be carried out.

An apparatus for removing cyclic noise from the output of a magnetic sensor according to the present invention comprises;

driving frequency controlling means for controlling the driving frequency of a refrigerator;

frequency detection means for detecting the characteristic frequency of a signal of a living organism, the signal being an object for measurement; and instruction means for detecting when a difference frequency is less than a predetermined threshold frequency, the difference frequency being the difference between the characteristic frequency of the signal of the living organism and the driving frequency of the refrigerator, and for supplying a driving frequency varying command to the driving frequency controlling means so as to increase the difference frequency between both frequencies.

When this apparatus is employed, the frequency detection means detects the characteristic frequency of the signal of the living organism. Then, the instruction means detects when the difference frequency is less than the predetermined threshold frequency, and supplies a driving frequency varying command to the driving frequency controlling means so as to increase the difference frequency. Consequently, a lowering of cyclic noise removing performance is prevented from occurring, the lowering being caused when the characteristic frequency of the signal of the living organism and the driving frequency of the refrigerator are nearly the same to one another. A magnetic field measurement signal of the living organism with high accuracy can be obtained regardless of the characteristic frequency of the signal of the living organism.

The above, and other objects, features and advantages of this invention will be apparent from the following detailed description of illustrative embodiments which are to be read with the accompanying drawings.

BRIEF DESCRIPTION OF THE DRAWINGS

FIG. 3 is a schematic diagram illustrating a cryogenic refrigerator, a SQUID gradiometer and a signal system thereof;

FIGS. 4A–4G are diagrams each illustrating the waveform of a signal at each stage of signal processings when a number of intervals is determined as two; wherein FIGS. 4A and 4D illustrate a waveform of a signal which includes magnetocardiogram and noise, FIG. 4B illustrates a waveform which is obtained by arithmetically averaging the waveform illustrated in FIG. 4A, FIGS. 4C and 4E illustrate a waveform which is obtained by subtracting the waveform illustrated in FIG. 4B from the waveform illustrated in FIG. 4A, FIG. 4F illustrates a waveform which is obtained by arithmetically averaging the waveform illustrated in FIG. 4E, and FIG. 4G illustrates a waveform which is obtained by subtracting the waveform illustrated in FIG. 4F from the waveform illustrated in FIG. 4A.

FIGS. 13A–13F are diagrams each illustrating the waveform of a signal at each stage of signal processings by the signal processing section illustrated in FIG. 12, wherein FIG. 13A illustrates a waveform of a magnetocardiogram measurement signal, FIG. 13B illustrates a waveform which is obtained by arithmetically averaging the waveform illustrated in FIG. 13A, FIG. 13C illustrates a waveform which is obtained by subtracting the waveform illustrated in FIG. 13B from the waveform illustrated in FIG. 13A, FIG. 13D illustrates a waveform which is obtained by arithmetically averaging the waveform illustrated in FIG. 13C, FIG. 13E illustrates a waveform which is obtained by subtracting the waveform illustrated in FIG. 13D from the waveform illustrated in FIG. 13A, FIG. 13F illustrates a waveform which is obtained by arithmetically averaging the waveform illustrated in FIG. 13E.

DETAILED DESCRIPTION OF THE PREFERRED EMBODIMENTS

Figure 1:
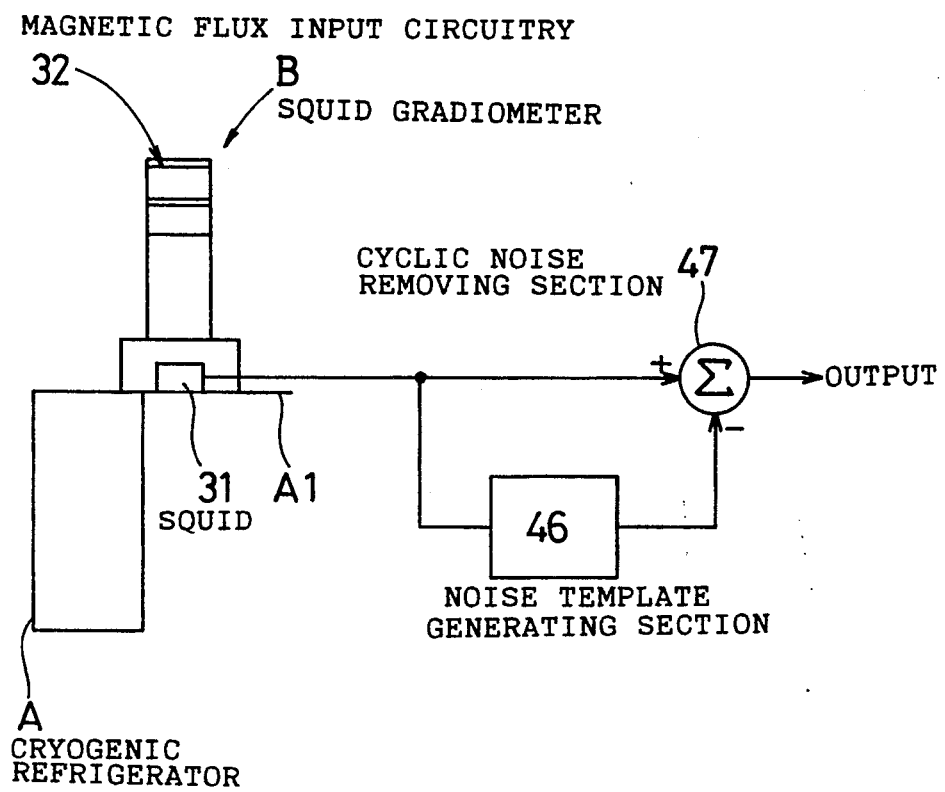
FIG. 1 is a schematic diagram illustrating a magnetic field measurement apparatus in which a cyclic noise removing apparatus according to a first apparatus embodiment of the present invention is incorporated.

FIG. 1 is a schematic diagram illustrating a magnetic field measurement apparatus in which a cyclic noise removing apparatus according to a first apparatus embodiment of the present invention is incorporated.

In this magnetic field measurement apparatus, a SQUID gradiometer B including a SQUID 31 and magnetic flux input circuitry 32 is disposed on a final cooling stage (for example, a cooling stage for cooling to about 4K) A1 of a cryogenic refrigerator A which includes plural cooling stages. The output signal from the SQUID gradiometer B is supplied to a noise template generating section 46 and a cyclic noise removing section 47. A noise template generated by the noise template generating section 46 is supplied to a reverse input terminal of the cyclic noise removing section 47.

The noise template generating section 46 arithmetically averages the output signal from the SQUID gradiometer B for every fundamental period of noise caused by the cryogenic refrigerator A so as to generate the noise template (template for cyclic noise) which excludes the object signal (the signal which is the object of measurement) and other noises. A signal with the cyclic noise removed therefrom is obtained by supplying the output signal from the SQUID gradiometer B to the non-reverse input terminal of the cyclic noise removing section 47 while the noise template is supplied to the reverse input terminal thereof.

FIG. 3 is a schematic diagram illustrating the SQUID gradiometer and peripheral devices thereof.

In this embodiment, the SQUID gradiometer is used to detect human magnetocardiogram (one species of biomagnetic field which are radiated from a human heart). In FIG. 3, a supporting member 1, on which a man M who is to have his magnetocardiogram detected is supported, is disposed in the interior of an electromagnetically shielded room (or a magnetically shielded room) R. A receiving member 2 is disposed beneath the supporting member 1, and a closed type vacuum casing 3 is fixed and supported on the receiving member 2. The bottom edge portion of the vacuum casing 3 is housed in the receiving member 2. A SQUID gradiometer B is housed in the upper interior of the vacuum casing 3. A reference character A indicates a cryogenic refrigerator using helium gas and having binary closed refrigerating circuitry. The cryogenic refrigerator cools to a helium liquefied temperature level at which the SQUID gradiometer B can operate.

Connected to the vacuum casing 3, is an expander 5 of precooling refrigerating circuitry 4, which comprises a part of the cryogenic refrigerator A, and an expanding unit 11 of Joule-Thompson (hereinafter referred to as J-T) circuitry 10, which also comprises a part of the cryogenic refrigerator A. The precooling refrigerating circuitry 4 is comprised of a cryogenic refrigerator which employs a Gifford-McMahon (hereinafter referred to as G-M) cycle. The precooling refrigerating circuitry 4 includes a precooling compressor (not shown) and the expander 5, both interconnected to a closed circuit so as to compress and expand helium gas for precooling helium gas in the J-T circuitry 10. The expander 5 is provided to a bottom plate of the vacuum casing 3 in a vibration isolated manner. The expander 5 includes a casing 6 which is fixed and disposed downward to the bottom plate of the vacuum casing 3. A cylinder 7, having a two stage arrangement, which is continuously disposed on the casing 6. The casing 6 has a high pressure gas inlet port 6a which is connected to a discharge side of the precooling compressor and a low pressure gas outlet port 6b which is connected to an intake side of the precooling compressor. The cylinder 7 projects upward into the interior of the vacuum casing 3 by passing through the bottom plate of the vacuum casing 3 in an air tight condition, and has a large diametered portion and a small diametered portion. A first heat station 8 for maintaining temperature levels (55–60K) is formed at the top edge portion of the large diametered portion, while a second heat station 9 for maintaining lower temperature levels (15–20K) than of the first heat station 8 is formed at the top edge portion of the small diametered portion.

In the cylinder 7, a displacer is inserted therein in a reciprocally movable manner. The displacer comparts the interior of the cylinder and forms expansion chambers at positions corresponding to the heat stations 8, 9. In the casing 6, a rotary valve (not shown) and a valve motor (not shown) are provided therein. The rotary valve rotates and opens itself at every rotation, so as to change a condition for supplying helium gas, which flows in from the high pressure gas inlet port 6a to the expansion chamber of the cylinder 7, to a condition for discharging helium gas, which expands into the expansion chamber from the low pressure gas outlet port 6b. The valve motor drives the rotary valve. The high pressure helium gas is Simon expanded in the expansion chamber interior the cylinder 7 by opening the rotary valve in the expander 5. A cold cryogenic temperature level is generated by the temperature lowering following the expansion of the helium gas. The generated cold temperature is maintained by the first and second heat stations 8, 9 of the cylinder 7. Therefore, the precooling refrigerating circuitry 4 having closed circuitry is constructed, the closed circuitry supplying the high pressure helium gas discharged by the precooling compressor to the expander 5, thereby lowering temperature of heat stations 8, 9 by adiabatic expansion at the expander 5 so as to precool the precooling machines 15, 16 (described later) of the J-T circuitry 10, and returning the expanded low pressure helium gas to the precooling compressor so as to recompress the low pressure helium gas.

The J-T circuitry 10 is refrigerating circuitry for compressing helium gas and for J-T expanding the compressed helium gas so as to generate cold at a helium liquefied temperature level of about 4K. The J-T circuitry 10 includes a J-T compressor (not shown) for compressing helium gas and an expanding unit 11 for J-T expanding the compressed helium gas. The expanding unit 11 includes a first J-T heat exchanger 12 which pierces the bottom plate of the vacuum casing 3 in an air tight condition. A second and third J-T heat exchangers 13, 14 disposed in the interior of the vacuum casing 3 are connected to the first heat exchanger 12. Each heat exchanger 12, 13, 14 exchange heat by helium gas, which flows through the primary side and the secondary side of the J-T heat exchanger. The primary side of the first J-T heat exchanger 12 is connected to the discharge side of the J-T compressor. Primary sides of the first and second J-T heat exchangers 12, 13 are connected to one another, interposing a first precooler 15 in between. The first precooler 15 is comprised of a heat exchanger which is disposed on the outer periphery of the first heat station 8 of the expander 5. Similarly, primary sides of the second and third J-T heat exchangers 13, 14 are connected to one another interposing a second precooler 16 in between. The second precooler 16 is comprised of a heat exchanger which is disposed on the outer periphery of the second heat station 9 of the expander 5. A primary side of the third J-T heat exchanger 14 is connected to a cooler 18, interposing a J-T valve IT there between. The J-T valve 15 J-T expands high pressure helium gas. The opening of the J-T valve is adjusted by an operating rod (not shown) at exterior the vacuum casing 3. The cooler 18 comprises a coil shaped pipe which is wound near the exterior of a cold receiving section 19a, which is positioned at the bottom surface of a cold receiving plate 19. The cold receiving plate 19 contacts the cooler 18 in a heat transferrable manner by the arrangement, so as to maintain the cold receiving plate 19 at a 4K stage, which is the same as the temperature of the cooler 18. The SQUID gradiometer B is provided on the cold receiving plate 19 in one body in a heat transferrable manner. The cooler 18 is connected to the secondary side of the first J-T heat exchanger 12, interposing secondary sides of the third and second J-T heat exchangers 14, 13 there between. The secondary side of the first J-T heat exchanger 12 is connected to the intake side of the J-T compressor.

Therefore, in the J-T circuitry 10, the J-T compressor compresses helium gas to a high pressure, and supplies the compressed gas to the vacuum casing 3. The compressed helium gas is heat exchanged with low pressure helium gas which returns to the J-T compressor, through the first, second and third J-T heat exchangers 12, 13, 14 in the vacuum casing 3. The compressed helium gas is also heat exchanged with the first and second heat stations 8, 9 so as to be cooled, at the first and second precoolers 15, 16. Thereafter, the compressed helium gas is J-T expanded at the J-T valve 17 and becomes gas-liquid mixed helium of 1 atmosphere and about 4K at the cooler 18. The cold receiving plate 19 and the SQUID gradiometer B contacted with the cold receiving plate 19 are cooled and maintained at a helium liquefied temperature level of about 4K by the latent heat of evaporization of the helium. Thereafter, the helium gas, its pressure lowered by the evaporization, is intaken by the J-T compressor through the secondary sides of the first, second and third J-T heat exchangers 12, 13, 14. The intaken helium gas is compressed again.

The SQUID gradiometer B includes a SQUID 31 which becomes superconductive under helium liquefied temperature levels and magnetic flux input circuitry 32 which is connected to the SQUID 31. The SQUID 31 is provided and fixed on the cold receiving plate 19 in a heat transferable manner. The magnetic flux input circuitry 32 includes a pick up coil 33 which is wound in loop shape to a cylindrical bobbin 34. The pick up coil 33 has four loops, for example. The pick up coil 33 has a double differential arrangement in which the top and bottom coils and the intermediate coils are serially interconnected with constant distances between the coils so that current direction in the former coils is the reverse of the current direction in the latter coils. That is, the SQUID gradiometer B costitutes a gradiometer which measures the gradient of the magnetic field using the pick up coil 33 which is formed by winding electrical line to form four loops.

On the top face of the cold receiving plate 19, a heat transferable bracket 20 is secured thereto so as to cover the SQUID 31 from upwards thereof. The bobbin 34 is provided on the top face of the bracket 20 in a standing manner. The bobbin 34 has a length of approximately 200–300 mm. The bobbin 34 projects up into an upwardly projected portion 3a which is formed at the center of the top plate of the vacuum casing 3. The pick up coil 33 is wound to the upper portion of the bobbin 34. Therefore, the pick up coil 33 is cooled to a temperature lower than the transition temperature of superconduction through the bobbin 34.

The top edge of the projected portion 3a faces a central opening 1a of the supporting member 1. The magnetocardiogram of a man M who is supported on the supporting member 1 is measured through the opening 1a.

In FIG. 3, a radiation shield 21 is disposed at an upper position interior of the vacuum casing 3 so as to surround the cold receiving plate 19, SQUID 31, bracket 20, bobbin 34 and other parts. The radiation shield 21 contacts the first heat station 8 of the expander 5 of the precooling refrigerating circuitry 4 so that the radiation shield 21 is maintained at a temperature of about 80K.

The output signal from the SQUID 31 of the SQUID gradiometer B is input to a computer 45 through a flux locked loop (hereinafter referred to as FLL) controller 41, an optical isolation amplifier 42, an anti-aliasing filter 43 and an analog to digital converter (hereinafter referred to as an AD converter) 44.

Processing steps for processing the output from the SQUID gradiometer B by the computer 45 is described later with reference of a flowchart illustrated in FIG. 2.

At first, measurement data D including an object signal and cyclic noise is considered, the cyclic noise being noise comprising a fundamental frequency component and higher harmonic components thereof. When the object signal is a signal which is able to be arithmetically averaged (in other word, when the object signal has periodicity, and arithmetically averaging is effective to the object signal) such as a magnetocardiogram, stimulus evoked field from human brain and others (refer to "YES" in FIG. 2), processing in step S0, which is processed just after starting, is advanced to step S1. On the other hand, when the object signal is not able to be arithmetically averaged, such as arrhythmia waves, spontaneous magnetic field from brain and others (refer to "NO" in FIG. 2), processing in step S0 is advanced to step S3 so as to determine the measurement data D as an object data D'. Thereafter, processing is advanced to step S4.

In step S1, an arithmetically averaged waveform Sa with respect to the signal is obtained from the measurement data D by employing a waveform in synchronism with the object signal as an trigger signal. When the signal is much larger in amplitude than the noise, the measurement data D itself is employed as an trigger signal.

Then in step S2, the arithmetically averaged waveform Sa is subtracted from signal portions of the measurement data D so as to eliminate the influence of the measurement data D and to obtain a waveform D' which mostly comprises noise. When the subtraction is carried out, discontinuous portions may occur in the obtained data D'. But, discontinuous portions can be prevented by removing a d.c. component from the arithmetically averaged waveform Sa or by multiplying a window function, of which the end point values and gradient converge to zero.

Thereafter, in step S4, subsequent processing is carried out so as to obtain a waveform as similar as possible to the noise waveform which waveform is included at an arbitrary position (arbitrary interval) n, having data length p of the measurement data D. The data length p is obtained by dividing a sampling frequency by a fundamental frequency of the noise. That is, the measurement data D is employed when processing is advanced from step S0 to step S1 while the waveform D' obtained in step S2 is employed otherwise. An averaged noise waveform Na is obtained by arithmetically averaging the employed data D or waveform D' for every data length p for k intervals prior to and after the interval n which occurs at the same time as the measurement data D.

In step S5, noise is removed from the arbitrary interval n of the measurement data D by subtracting the averaged noise waveform Na from the interval n of the measurement data D.

In step S6, a waveform D" which scarcely includes noise is obtained by performing processings in steps S4, S5 for every interval of the measurement data D.

When the noise includes a little frequency varying, frequency varying can be taken into consideration in steps S4, S5 by calculating the cross correlation of each interval with the interval n of the waveform D' when arithmetically averaging for the noise is carried out. Frequency varying between one cycle of the fundamental frequency of the noise and the neighbouring cycle of the noise is ususally equal to or less than 0.1% when the noise source is vibration of the cryogenic refrigerator A. Therefore, cross correlation is not required to be calculated for every interval, but is sufficient to be calcuated for intervals corresponding to about 1% of one cycle of the fundamental frequency of the noise. As a result, very little processing time period is required.

When processing advances from step S0 to step S4 through step S3, a sufficient number of times (2K+1) of arithmetically averaging in step S4 is required. That is because influence of the signal included in the averaged noise waveform Na is in inverse proportion to the number of times (2K+1) when processings are made in steps S1, S2.

In this embodiment, a noise template generation means 46 is constituted by step S4. The noise template generation means 46 arithmetically averages the output signal from the SQUID gradiometer B with performing phase matching at every fundamental cycle of vibration of the refrigeratiiong machine A, so as to generate a template of cyclic noise which has the object signal and other noise removed therefrom.

A cyclic noise removing means 47 is constituted by steps S5, S6. The cyclic noise removing means 47 subtracts the cyclic noise template obtained by the noise template generation means 46 from the measurement signal D with performing phase matching so as to obtain the object signal.

Operation of the embodiment is described as follows.

The SQUID gradiometer B is cooled following driving of the helium cryogenic refrigerator A. The SQUID gradiometer B becomes ready to be operated when the SQUID gradiometer B is cooled to a helium liquefied temperature level of about 4K.

More specifically, when the helium cryogenic refrigerator A reaches a steady operating condition after the compressors of the precooling refrigerating circuitry 4 and the J-T circuitry 10 are started, high pressure helium gas supplied from the compressor for precooling expands at the expander 5 of the precooling circuitry 4. The first heat station 8 is cooled to a temperature level of 55–60K and the second heat station 9 is cooled to a temperature level of 15–20K, respectively, by temperature lowering following the expansion of the helium gas.

At the same time, in the J-T circuitry 10, high pressure helium gas discharged from the compressor is supplied to the vacuum casing 3. The supplied high pressure helium gas enters in the primary side of the first J-T heat exchanger 12 and is cooled from room temperature (300K) to about 70K by heat exchanging with the low pressure helium gas in the secondary side thereof which returns to the compressor side. Thereafter, the high pressure helium gas enters the precooler 15 at the outer periphery of the first heat station 8 of the expander 5, the first heat exchanger 8 being cooled to 55–60K, and is cooled to about 55K. The cooled helium gas enters the primary side of the second J-T heat exchanger 13 and is cooled to about 200K by heat exchanging with the low pressure helium gas in the secondary side thereof. Thereafter, the cooled helium gas enters the second precooler 16 at the outer periphery of the second heat exchanger 9 of the expander 5, the second heat exchanger 9 being cooled to 15–200K, and is cooled to about 15K. The cooling mechanism at the second heat exchanger 9 is similar to that of the first heat exchanger 8. Further, the cooled helium gas enters the primary side of the third heat exchanger 14 and is cooled to about 5K by heat exchanging with the low pressure helium gas in the secondary side thereof. After that, the cooled helium gas is supplied to the J-T valve 17. In the J-T valve 17, the cooled high pressure helium gas is throttled, and then is J-T expanded so as to become gas-liquid mixed helium of 1 atmosphere and about 4K. The gas-liquid mixed helium is supplied to the cooler 18, which is disposed on the downstream side of the J-T valve 17. The cold receiving plate 19 is cooled by the latent heat of vaporization of the liquid portion of the gas-liquid mixed helium in the cooler 18. The SQUID 31, bobbin 34 and pick up coil 33 of the magnetic flux input circuitry 32 of the SQUID gradiometer B which contacts the cold receiving plate 19 in a heat transferrable manner, are cooled following cooling of the cold receiving plate 19.

The vapored low pressure helium gas returns from the cooler 18 to the secondary side of the third J-T heat exchanger 14 and becomes saturated helium gas of 4K during the returning process. The saturated helium gas passes through the secondary sides of the second and first heat exchangers 13, 12, and simultaneously cools the high pressure helium gas in the primary sides thereof, raising its temperature finally to about 300K (room temperature). After that, the saturated helium gas returns to the intake side of the compressor. One cycle of the precooling refrigerating circuitry 4 and the J-T circuitry 10 is completed by the above-mentioned processings. Refrigerating operation of the cryogenic refrigerator A is carried out by repeating similar cycles thereafter. The SQUID gradiometer B is cooled toward helium liquefied temperature levels (operable temperature levels) by continuously carrying out the refrigerating operation of the cryogenic refrigerator A. The SQUID gradiometer B becomes operable after the SQUID gradiometer B reaches a helium liquefied temperature level.

The processing steps in this embodiment for obtaining an object magnetocardiogram by eliminating noise caused by vibration of the cryogenic refrigerator A based upon the output signal D output from the SQUID gradiometer B, are described with reference to FIGS. 4A–4G.

Figure 4B:
Figure 4C:
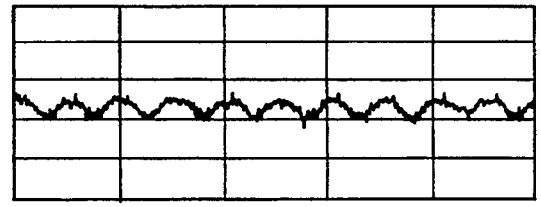
Figure 4F:
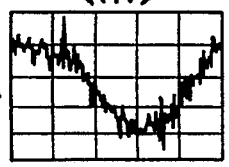

A waveform 1 illustrated in FIGS. 4A and 4D is the data D which includes the magnetocardiogram and the noise caused by vibration of the cryogenic refrigerator A. Processing in the flowchart illustrated in FIG. 2 advances from step S0 to step S1 because the magnetocardiogram is able to be arithmetically averaged. Then, a waveform 2 (arithmetically averaged waveform Sa) illustrated in FIG. 4B is obtained by arithmetically averaging the data D with respect to the magnetocardiogram.

Figure 2:
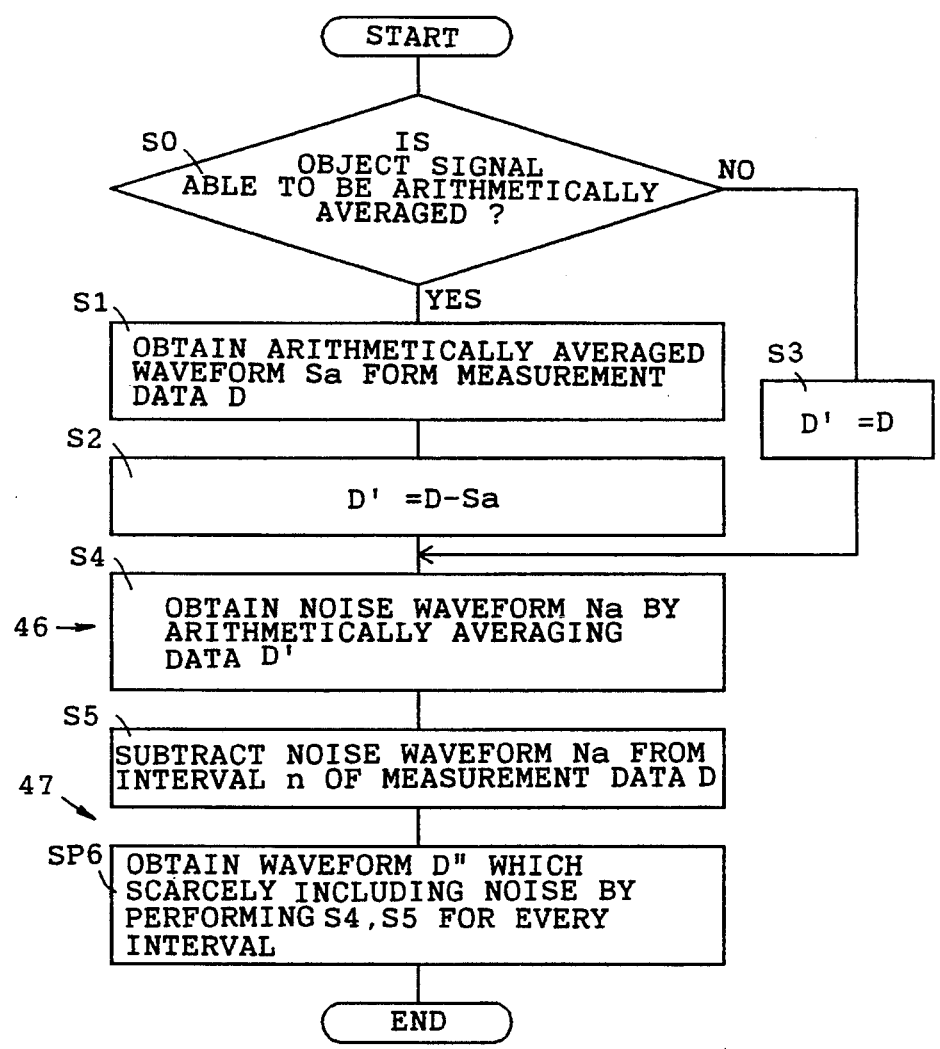
FIG. 2 is a flowchart useful in understanding a cyclic noise,. removing method according to a first method embodiment of the present invention.

Next, a waveform 3 (data D', refer to FIG. 4C) which mostly comprises noise and no magnetocardiogram is obtained by subtracting the waveform 2 from the waveform 1 (refer to step S2 in the flowchart in FIG. 2).

The following processing is carried out so as to obtain a noise template Na as similar as possible to the noise waveform in which noise template Na is included at an arbitrary position (arbitrary interval) c having data length p of the waveform 1. The data length p is obtained by dividing a sampling frequency by a fundamental frequency of the noise. That is, the noise template (averaged noise waveform) Na (refer to a waveform 4 illustrated in FIG. 4F) is obtained by arithmetically averaging the waveform 3 (refer to data D') for every 2 (=k) intervals prior to and after the interval c which occurs at the same time as of the measurement data D. Arithmetically averaging the waveform 3 is carried out with cross correlation of the interval c with each of intervals a, b, d and e for about 1% of the data length p, for taking frequency varying of noise into consideration.

Figure 4G:
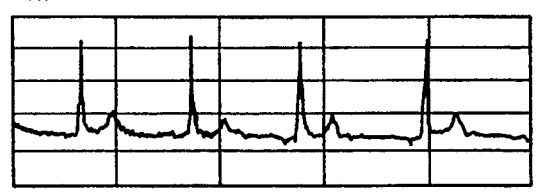

Noise can be removed from the interval c of the waveform 1 (measurement data D) by subtracting the waveform 4 (averaged noise waveform Na) from the interval c of the waveform 1 (measurement data D). A waveform 5 (a waveform D" which scarcely includes noise) illustrated in FIG. 4G is obtained by applying the noise removing mentioned above to every interval of the waveform 1.

The noise caused by the vibration of the cryogenic refrigerator A can be removed from the output signal from the SQUID gradiometer B so as to obtain an object magnetocardiogram accurately without applying corrective action for vibration isolation to the cryogenic refrigerator A even when the cryogenic refrigerator A generates vibration. That is because the noise template is generated by treating the output signal data from the SQUID gradiometer B. The noise caused by the vibration of the cryogenic refrigerator A is removed from the output signal from the SQUID gradiometer B using the noise template. Further, the signal system may sufficiently be only one channel, and a sufficient number of times for measurement may be one. Thereby, a simplified system arrangement can be obtained.

Furthermore, when the output signal from the SQUID gradiometer B is added and when the noise template is subtracted from the output signal from the SQUID gradiometer B, more accurate detection of the magnetocardiogram is carried out because the signals have their phases matched to one another so that the cycles of the output signal and the noise are exactly matched to one another.

Figure 5:
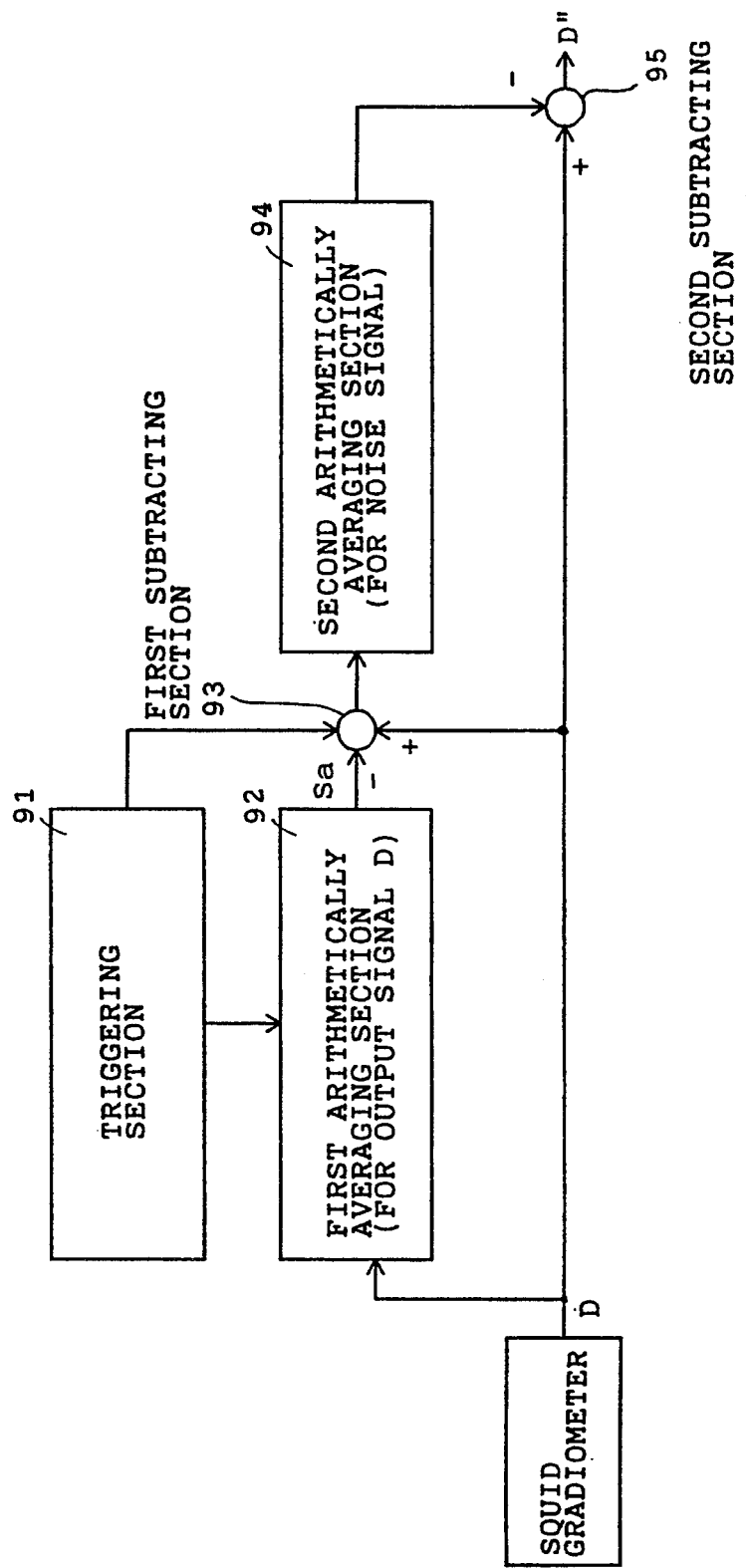
FIG. 5 is a schematic diagram illustrating a noise removing apparatus according to a second apparatus embodiment of the present invention.

FIG. 5 is a block diagram according to a second embodiment schematically showing an arrangement of a cyclic noise removing apparatus which performs similar processing of the flowchart in FIG. 2.

The apparatus comprises, a triggering section 91 for outputting a trigger signal based upon an object signal, for example, a first arithmetically averaging section 92 for obtaining an averaged signal waveform Sa by arithmetically averaging an output signal D from the SQUID gradiometer B based upon the trigger signal output from the triggering section 91, a first subtracting section 93 for obtaining a signal waveform D' which mostly comprises noise by subtracting the averaged signal waveform Sa from the output signal D from the SQUID gradiometer B based upon the trigger signal output from the triggering section 91, a second arithmetically averaging section 94 for obtaining an averaged noise waveform Na for intervals from the (n−k)-th interval to the (n+k)-th interval by arithmetically averaging prior to and after k cycles with respect to a position n for the signal waveform D', the position n being determined by determining a position n as a center of a portion n of the output signal D from the SQUID gradiometer B to have its noise removed, and a second subtracting section 95 for obtaining a waveform D'' which scarcely includes noise by subtracting the averaged noise waveform Na from the portion n objected noise removal of the output signal D from the magnetic sensor.

When this apparatus is employed, the noise caused by the vibration of the cryogenic refrigerator A can be removed from the output signal from the SQUID gradiometer B so as to obtain the object magnetocardiogram accurately without applying corrective action for vibration isolation to the cryogenic refrigerator A, even when the cryogenic refrigerator A generates vibration. That is because the noise template is generated by treating the output signal data from the SQUID gradiometer B, so that the noise caused by the vibration of the cryogenic refrigerator A is removed from the output signal from the SQUID gradiometer B using the noise template. Further, the signal system may sufficiently be only one channel and the sufficient number of times for measurement may be one. Thereby a simplified system arrangement can be obtained.

Figure 6:
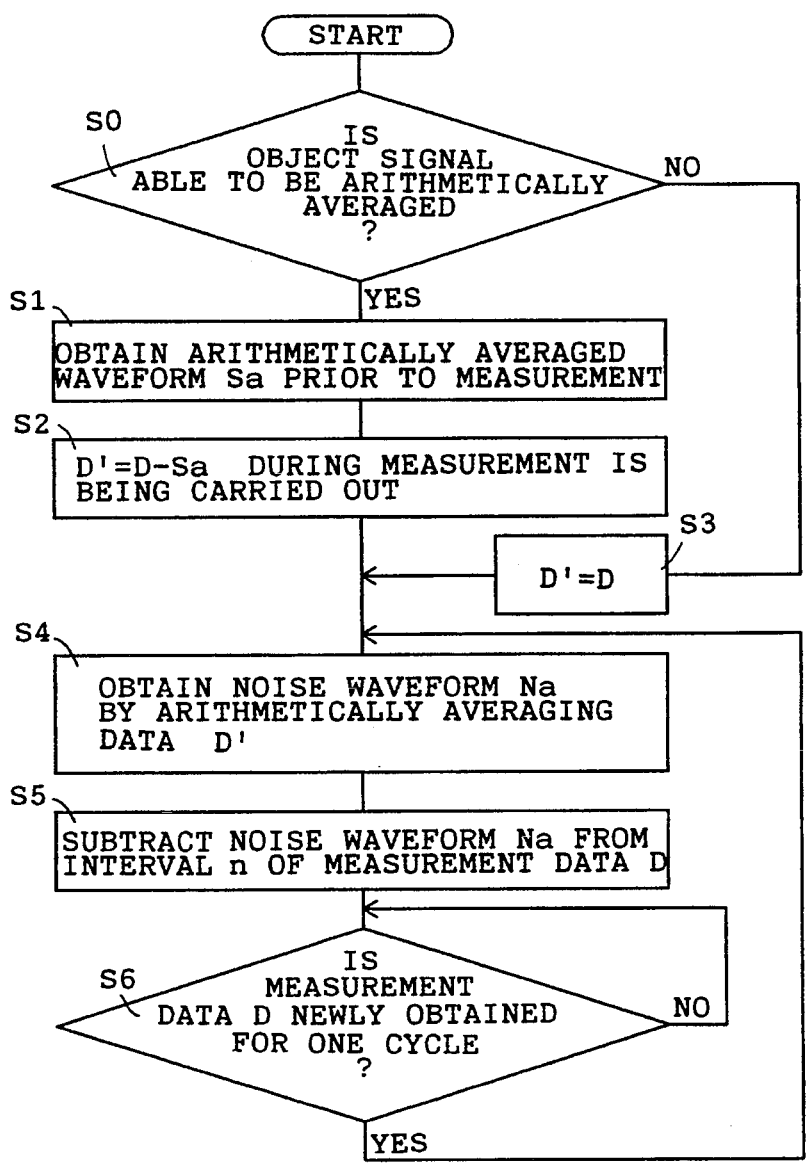
FIG. 6 is a flowchart useful in understanding a cyclic noise removing method according to a second method embodiment of the present invention.

FIG. 6 is a flowchart according to a second method embodiment explaining the process for removing cyclic noise from the measurement data in real time processing.

The flowchart in FIG. 6 differs from the flowchart in FIG. 2 in that;

in step S1, the arithmetically averaged waveform Sa is obtained by arithmetically averaging the object signal prior to starting measurement, in step S2, the waveform D' which mostly comprises noise is obtained by subtracting the arithmetically averaged waveform Sa from the measurement data D, while the measurement is being carried out, in step S4, an averaged noise waveform Na for intervals from the (n−k)-th interval to the n-th interval is obtained by arithmetically averaging prior k cycles with respect to a position n for the signal waveform D' so as to remove noise from the portion n of the measurement data D, the portion n having just been measured, in step S6, it is awaited that the measurement data D be newly obtained for one cycle, and when the measurement data D is newly obtained for one cycle, processing in step S4 is carried out again, instead of step S6 in the flowchart in FIG. 2.

When this embodiment is employed, cyclic noise can be removed at every obtaining of one cycle of the measurement data D, that is real time processing for noise removal can be carried out.

Figure 7:
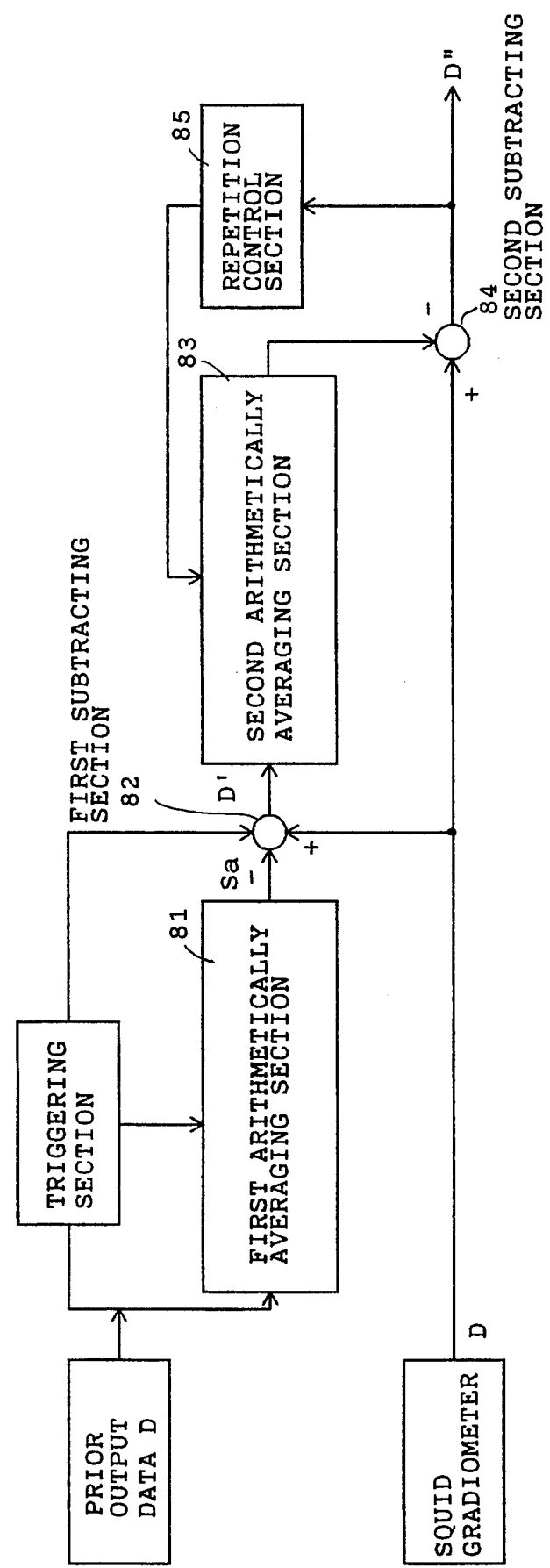
FIG. 7 is a schematic diagram illustrating a noise removing apparatus according to a third apparatus embodiment of the present invention.

FIG. 7 is a block diagram schematically showing an arrangement of a cyclic noise removing apparatus according to a third apparatus embodiment, which removes cyclic noise from the measurement data in real time processing.

The apparatus comprises, a first arithmetically averaging section 81 for obtaining an averaged signal waveform Sa by arithmetically averaging an output signal D from the SQUID gradiometer B using the object signal itself as a trigger signal, a first subtracting section 82 for obtaining a signal waveform D' which mostly comprises noise by subtracting the averaged signal waveform Sa from the output signal D from the SQUID gradiometer B using the object signal itself as a trigger signal, a second arithmetically averaging section 83 for obtaining an averaged noise waveform Na for intervals from the (n−k)-th interval to the n-th interval by arithmetically averaging prior k cycles with respect to a position n (which length corresponding to one cycle of the fundamental frequency of the cyclic noise) for the signal waveform D' so as to remove noise from the position n of the output signal D just measured now from the SQUID gradiometer B, a second subtracting section 84 for obtaining a waveform D'' which scarcely includes noise by subtracting the averaged noise waveform Na from the portion n of the output signal D output from the magnetic sensor to have its noise removed, and a repetition control section 85 for operating the second arithmetically averaging section 83 at every time the output signal D from the SQUID gradiometer B is obtained for one cycle.

When this apparatus is employed, cyclic noise can be removed at every obtaining of one cycle of the measurement data D, that is, real time processing for noise removal can be carried out.

This invention can of course be applicable to a SQUID gradiometer which is used for measurements other than magnetocardiogram measurements. Also, this invention can of course be applicable to other sensors which operate in a cooled condition by a cyclic refrigerator.

Figure 8:
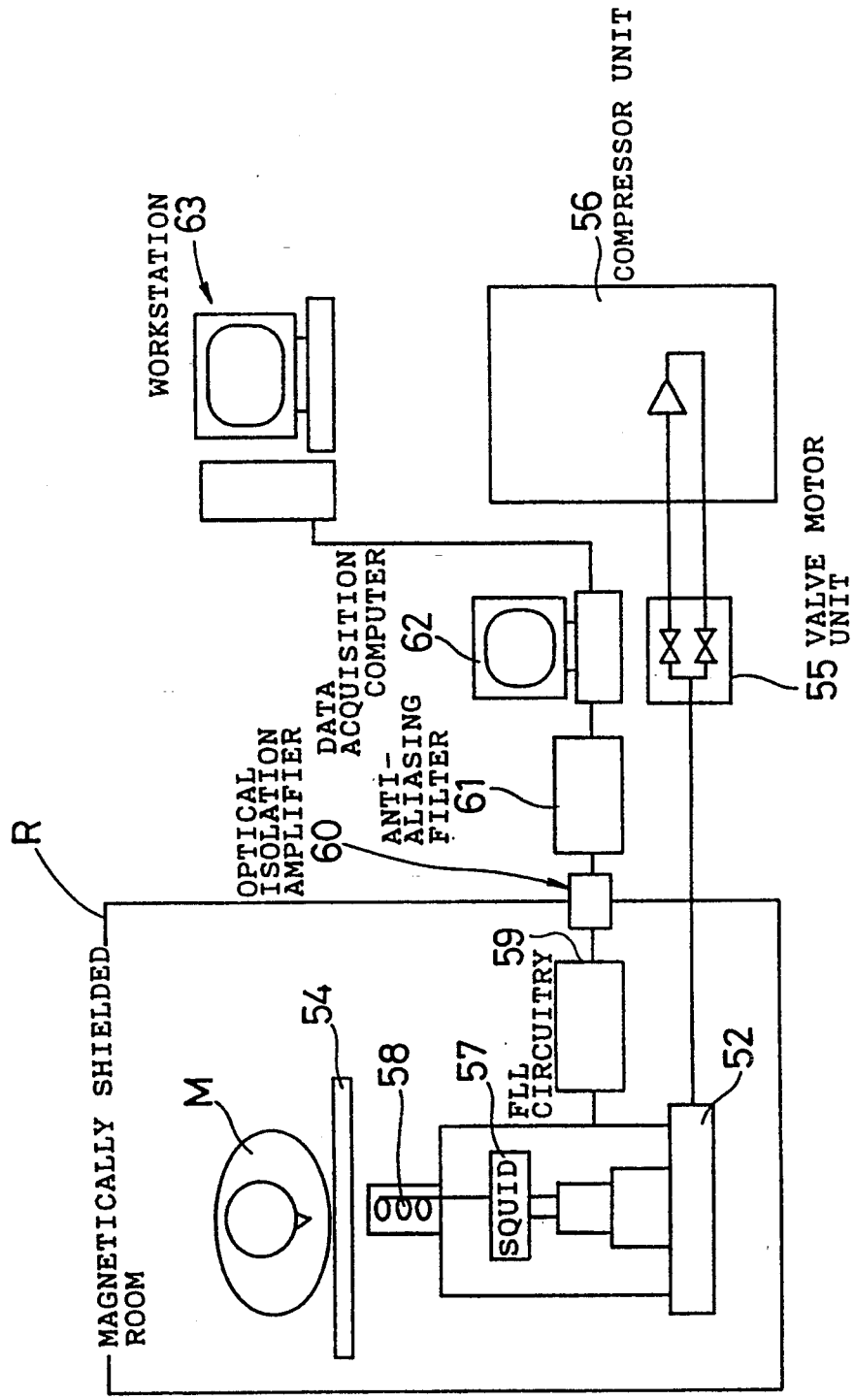
FIG. 8 is a schematic diagram illustrating a magnetocardiogram measurement system.

FIG. 8 is a schematic diagram illustrating a magnetocardiogram measurement system to which a noise removing method according to the present invention is applied.

A 4K cryogenic refrigerator 52 is disposed on a floor in a magnetically-shielded room R, and a man M is laid down on his face on a bed 54 which is able to be moved on horizontal plane so as to measure the magnetocardiogram of the man M. A valve motor unit 55 and a compressor 56, which constitute part of a cryogenic refrigerator system and act as electromagnetic noise source, are disposed outside of the magnetically shielded room R. A SQUID 57 and a pick up coil 58 are cooled to their operating temperature by the 4K cryogenic refrigerator (G-M/J-T cryocooler) 52. The SQUID 57 is a thin film device which includes two Josephson junctions having the arrangement of Nb/A10X/Nb. The pick up coil 55 has a second order differential arrangement.

The output signal from the SQUID 57 is supplied to an FLL circuitry 59. An output signal from the FLL circuitry 59 is guided to outside the magnetically shielded room R through an optical isolation amplifier 60, and is then collected in a data acquisition computer 62 (Masscomp MC5400, Concurrent company) through an anti-aliasing filter 61. Data processing/displaying after measurement is carried out on a workstation 63 (COMTEC 4D, Daikin Industries, Ltd.).

Figure 9A:
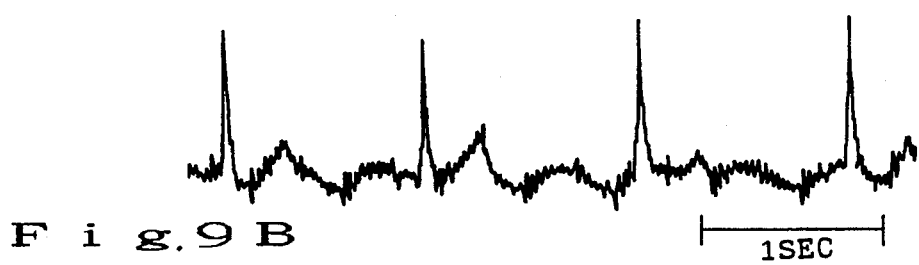
FIG. 9A is a diagram illustrating a waveform measured by the magnetocardiogram measurement system.

One of the raw data of a healthy man's magnetocardiogram, measured by this system, is illustrated in FIG. 9A, and it is understood that noise of a low frequency is mixed to the magnetocardiogram waveform. It is thought that the reason for this is that the vibration caused by reciprocal movement of a displacer in the 4K cryogenic refrigerator 52 is transmitted to the pick up coil 58, and the pick up coil 58 vibrates in the residual magnetic field in the interior the magnetically shielded room R.

Figure 9B:
FIG. 9B is a diagram illustrating a waveform which has cyclic noise removed therefrom.

The noise frequency comprises 2Hz for the most part and higher harmonics thereof, because the moving frequency of the displacer is 2Hz. Therefore, a waveform which includes little magnetocardiogram is obtained by arithmetically averaging the measurement waveform (refer to FIG. 9A), and by subtracting the arithmetically averaged waveform from the original waveform (refer to FIG. 9A). The waveform which includes little magnetocardiogram repeats the same waveform every 0.5 seconds because the fundamental frequency of the noise caused by the vibration is 2 Hz. Therefore, the remaining magnetocardiogram and random noise are decreased so as to obtain a noise waveform caused by the vibration by arithmetically averaging the waveform for every 0.5 seconds. By subtracting this waveform from the measurement waveform (refer to FIG. 9A), a magnetocardiogram which has noise caused by the vibration removed therefrom is then obtained (refer to FIG. 9B).

Figure 10:
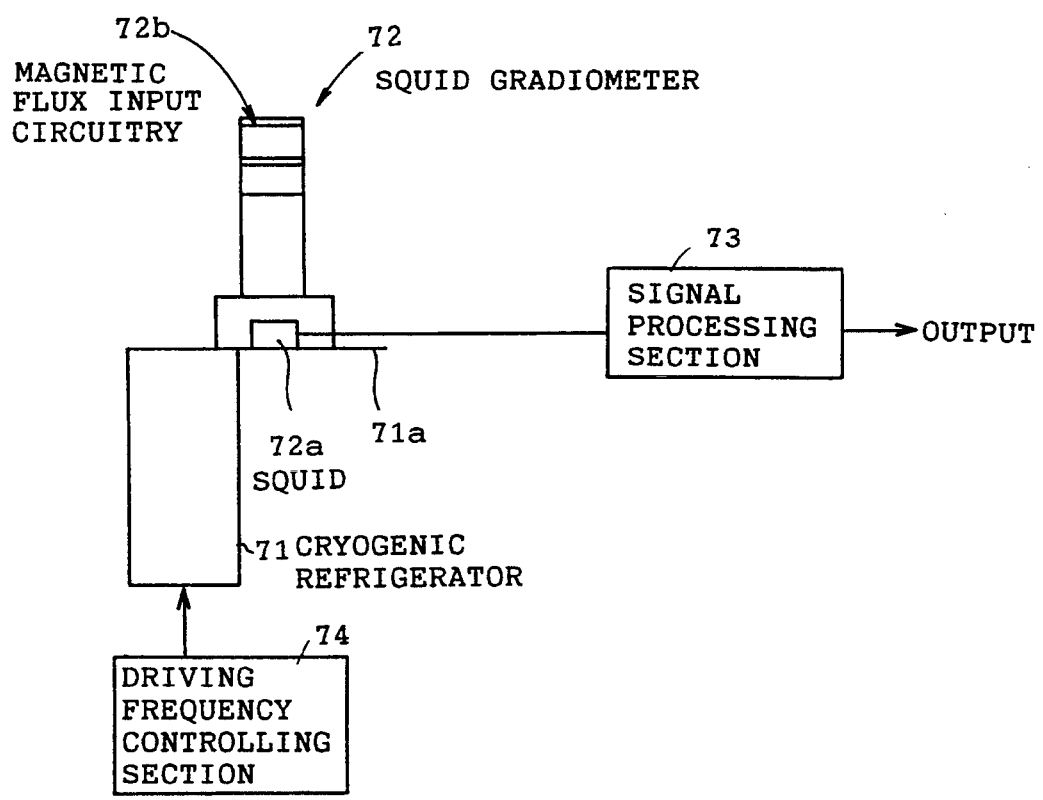
FIG. 10 is a schematic diagram illustrating a cyclic noise removing apparatus according to a fourth apparatus embodiment of the present invention.

FIG. 10 is a schematic diagram illustrating a cyclic noise removing apparatus according to a fourth apparatus embodiment. FIG. 10 illustrates a case in which the cyclic noise removing apparatus is applied to magnetocardiogram measurement.

In a magnetocardiogram measurement apparatus, a SQUID gradiometer 52 including a SQUID 722 and magnetic flux input circuitry 72b is disposed on a final cooling stage (for example, a cooling stage for cooling to about 4K) 71a of a cryogenic refrigerator 71 which includes plural steps of cooling stages. An output signal from the SQUID gradiometer 72 is supplied to a signal processing section 53. Further, the driving frequency of the cryogenic refrigerator 71 is controlled by a driving frequency controlling section 74.

Figure 11:
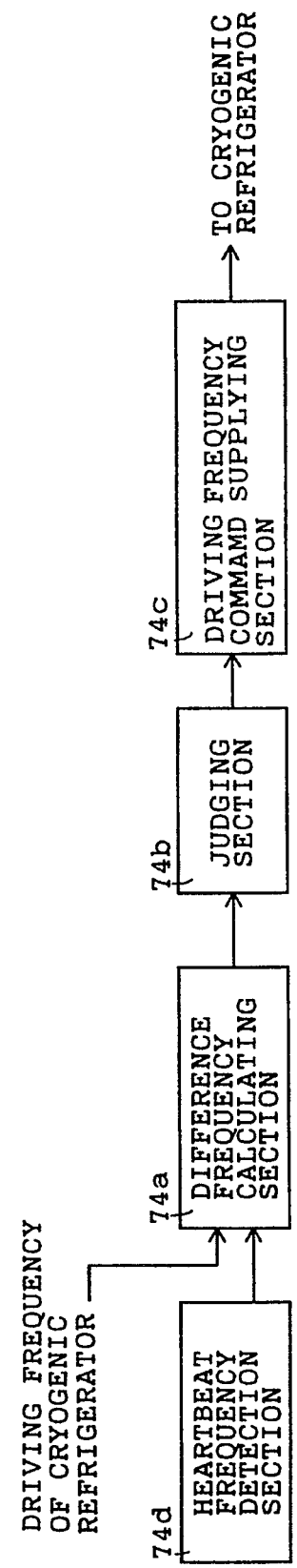
FIG. 11 is a block diagram illustrating a driving frequency controlling section in detail.

FIG. 11 is a block diagram showing the driving frequency controlling section 54 in detail.

The driving frequency controlling section 54 includes, a difference frequency calculating section 74a for calculating a difference frequency between a driving frequency of the cryogenic refrigerator 51 at the present time and a heartbeat frequency detected by a heartbeat frequency detection section 54d, a judging section 74b for judging whether or not the absolute value of the difference frequency is equal to or less than a predetermined threshold value, and a driving frequency command supplying section 74c for supplying a driving frequency command to the cryogenic refrigerator 71 so as to increase the absolute value of the difference frequency in response to a judgement result of the judging section 74b indicative of the absolute value of the difference frequency being equal to or less than the predetermined threshold value, and for supplying a driving frequency command, which is the same as the preceeding driving frequency command, to the cryogenic refrigerator 71 in response to a judgement result of the judging section 74b indicative of the absolute value of the difference frequency being greater than the predetermined threshold value. The driving frequency command instructs that a frequency of a power source which supplies power to a valve motor of the cryogenic refrigerator 71 is determined to be a predetermined frequency, for example.

A frequency of a magnetocardiogram can be detected as a heartbeat frequency (usually 0.8–2 Hz), and the heartbeat frequency can exactly be detected by an electrocardiogram and the like. A driving frequency (ususally 2–2.4 Hz) of the cryogenic refrigerator 71 at the present time can be detected by a frequency of a power source which is supplied to the valve motor. Therefore, a difference frequency between both frequencies is calculated by the difference frequency calculating section 74a. Only when it is judged that an absolute value of the difference frequency is equal to or less than the predetermined threshold value (that is, an absolute value of the difference frequency is remarkably small, because the predetermined threshold value is usually determined to be a remarkable small value) by the judging section 74b, the driving frequency command supplying section 74c supplies a new driving frequency command to the cryogenic refrigerator 71 so as to increase the absolute value of the difference frequency. As a result, the condition can be omitted that the heartbeat frequency and the driving frequency of the cryogenic refrigerator 71 are nearly equal to one another.

Figure 12:
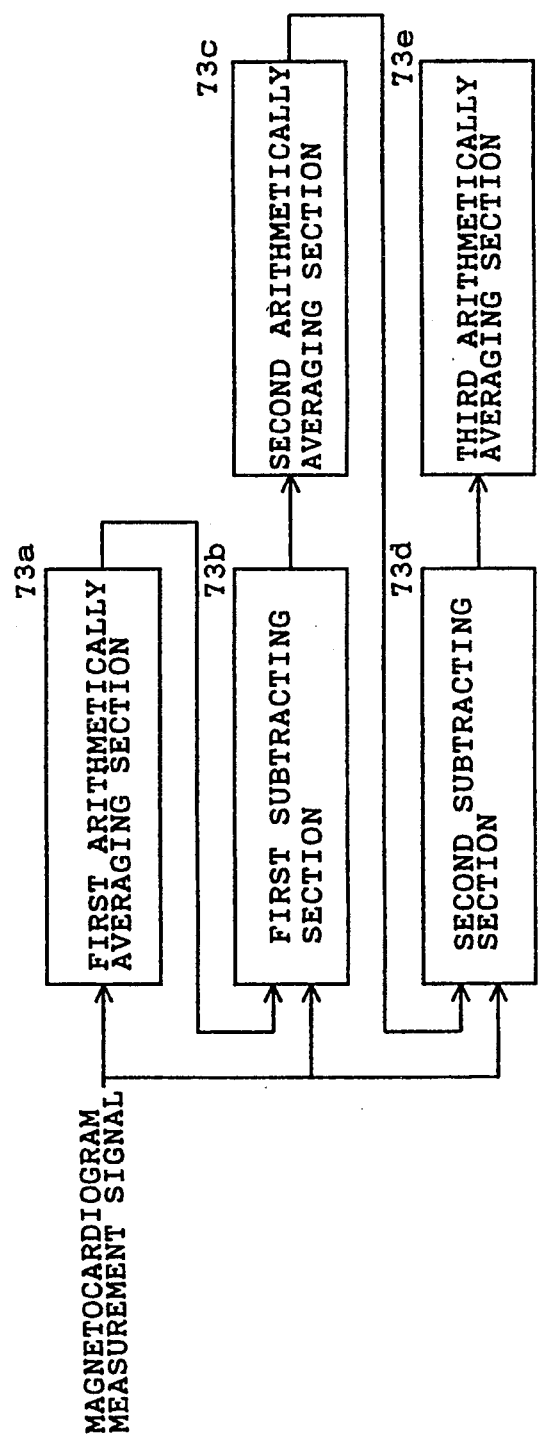
FIG. 12 is a block diagram, illustrating a signal processing section in detail.

FIG. 12 is a block diagram showing the signal processing section 73 in detail.

The signal processing section 73 includes, a first arithmetically averaging section 732 for obtaining a magnetocardiogram which has cyclic noise and non-cyclic noise removed therefrom, by arithmetically averaging the magnetocardiogram in time to a predetermined timing of the magnetocardiogram, a first subtracting section 73b for obtaining a noise signal by subtracting the magnetocardiogram obtained by the first arithmetically averaging section 73a from the measured magnetocardiogram, a second arithmetically averaging section 73c for obtaining a noise template by arithmetically averaging the noise signal for every vibration cycle of the cryogenic refrigerator 71, the noise signal being obtained by the first subtracting section 73b, a second subtracting section 73d for subtracting the noise template from the measured magnetocardiogram, and a third arithmetically averaging section 73e for obtaining a magnetocardiogram which has noise components removed therefrom, by arithmetically averaging the signal obtained by the second subtracting section 73d in time to a predetermined timing of the magnetocardiogram.

FIGS. 13A–13F are diagrams illustrating signal waveforms. These diagrams are useful in understanding processing in the signal processing section 73. The waveforms are obtained which are the same as of the preceeding embodiment.

Figure 13A:
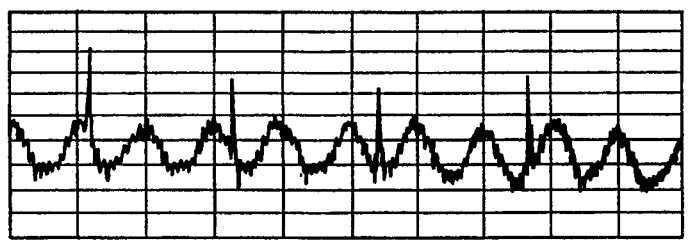
Figure 13B:
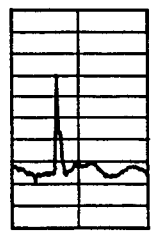
Figure 13C:
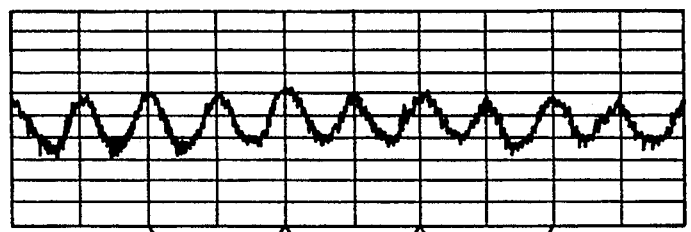
Figure 13D:
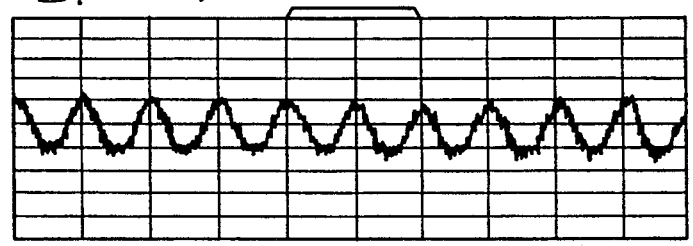
Figure 13E:
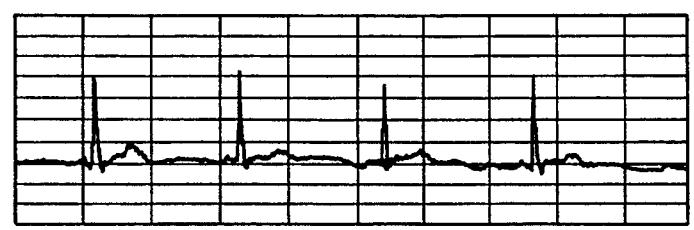
Figure 13F:
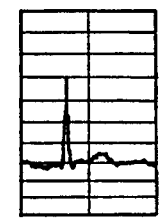

When a magnetocardiogram measurement signal illustrated in FIG. 13A is obtained from the SQUID gradiometer 72, a magnetocardiogram is obtained as is illustrated in FIG. 13B which has cyclic noise and non-cyclic noise removed therefrom to a great extent, by arithmetically averaging the magnetocardiogram measurement signal in time to a predetermined timing of the magnetocardiogram by the first arithmetically averaging section 74a. Then, a noise signal having considerably high accuracy is obtained by subtracting the magnetocardiogram illustrated in FIG. 13B from the magnetocardiogram measurement signal illustrated in FIG. 13A. Thereafter, a noise template comprising only cyclic noise is obtained as is illustrated in FIG. 13D, by arithmetically averaging the noise signal illustrated in FIG. 13C by the second arithmetically averaging section 73c for every vibration cycle of the cryogenic refrigerator 71. After that, a magnetocardiogram which has cyclic noise removed therefrom with high accuracy is obtained as is illustrated in FIG. 13E by subtracting the noise template illustrated in FIG. 13D from the magnetocardiogram measurement signal illustrated in FIG. 13A by the second subtracting section 73d. Finally, a magnetocardiogram from which non-cyclic noise is further removed is obtained as is illustrated in FIG. 13F by arithmetically averaging the magnetocardiogram illustrated in FIG. 13E in time to a predetermined timing of the magnetocardiogram by the third arithmetically averaging section 73e, because the magnetocardiogram has periodicity.

The signal processing section 73 performs noise removal with high accuracy presupposing that the driving frequency of the cryogenic refrigerator 71 regulating a frequency of cyclic noise and the heartbeat frequency (equal to a frequency of magnetocardiogram) are not identical to one another. To ensure this presumption, this embodiment determines that the driving frequency of the cryogenic refrigerator 71 by the driving frequency controlling section 74 be a frequency which is sufficiently different from the heartbeat frequency, whereby noise removal with high accuracy by the signal processing section 73 is performed so that a magnetocardiogram with high accuracy is obtained.

More particularly, noise removal with high accuracy can usually be performed by the signal processing section 73 without varying the driving frequency of the cryogenic refrigerator 71, because a heartbeat frequency usually varies to some degree. But, a case may occur where the heartbeat frequency is kept constant for magnetocardiogram measurement period of about one minute, and the constant heartbeat frequency is nearly the same as the driving frequency of the cryogenic refrigerator 71. In this case, noise is insufficiently removed even when arithmetically averaging processing is simply repeated. Otherwise in this embodiment, noise removal with high accuracy can be performed by the signal processing section 73 regardless of the state of a heartbeat frequency, because the embodiment determines the driving frequency of the cryogenic refrigerator 71 so as to enlarge the difference between the driving frequency of the cryogenic refrigerator 71 and the heartbeat frequency when both frequencies are nearly equal to one another.

In this embodiment, the apparatus may judge whether or not the driving frequency of the cryogenic refrigerator 71 and the heartbeat frequency are identical to one another, instead of judging the absolute value of the difference frequency and the predetermined threshold value in their sizes. The apparatus is applicable to other magnetic magnetic field measurement apparatus for measuring biomagnetic field having periodicity, similar to the magnetocardiogram, other than the magnetocardiogram. The apparatus may vary the driving frequency manually.

The cyclic noise removing methods and apparatus according to the present invention are widely applicable to methods and apparatus for removing only cyclic noise from a mixed signal in which a cyclic signal and cyclic noise are included, when the cyclic signal and cyclic noise are mixed to one another and the cycle of the cyclic signal and the cycle of the cyclic noise are different from one another.

Various modifications and variations will occur to those skilled in the art without departing from the spirit and scope of the invention as defined by the appended claims.

What is claimed is:

1. A method for removing cyclic noise from an output signal from a magnetic sensor which removes cyclic noise caused by vibration of a refrigerator from said output signal from said magnetic sensor which is cooled by said refrigerator to an operable low temperature so as to obtain an object signal, said method comprising the steps of;
    (a) arithmetically averaging said output of said magnetic sensor for every integral fundamental period of noise caused by vibration of said refrigerator so as to generate a template of a cyclic noise, said template substantially omitting said object signal for measurement and other noise; and
    (b) subtracting said template from said output of said magnetic sensor so as to obtain said object signal.

2. A method as set forth in claim 1, wherein said step (a) further includes a step in which said output signal is phase matched when said output signal of said magnetic sensor is added.

3. A method as set forth in claim 1, wherein said step (a) further includes a step in which data is obtained by subtracting an averaged object signal from said output signal of said magnetic sensor, which data being used to generate said template of said cyclic noise.

4. A method as set forth in claim 1, further comprising a step of arithmetically averaging a signal obtained by said step (b), when said object signal has periodicity.

5. A method as set forth in claim 1, wherein said step (a) includes the following steps of;
    (c) arithmetically averaging said output signal of said magnetic sensor using a waveform in synchronism with said object signal as a trigger signal, so as to obtain an arithmetically averaged signal, (d) subtracting said arithmetically averaged signal from said output signal of said magnetic sensor so as to obtain a difference signal, and (e) arithmetically averaging said difference signal for a predetermined number of cycles which are prior to and after a position of a portion, which is to have cyclic noise removed therefrom, of said output signal of said magnetic sensor, so as to obtain an averaged noise signal.

6. A method for removing cyclic noise from an output signal from a magnetic sensor which method removes cyclic noise caused by vibration of a refrigerator from said output signal from said magnetic sensor which is cooled by said refrigerator to an operable low temperature so as to obtain an object signal, said method comprising the steps of;

(a) arithmetically averaging said object signal using said object signal as a trigger signal prior to starting measurement, so as to obtain an arithmetically averaged signal, (b) performing actual measurement so as to obtain said output of said magnetic sensor, and subtracting said arithmetically averaged signal from said output signal of said magnetic sensor so as to obtain a difference signal;

(c) arithmetically averaging said difference signal for a predetermined number of prior cycles so as to obtain an averaged noise signal, said prior cycles being determined with respect to a position corresponding to a portion of said output signal of said magnetic sensor, which portion is to have cyclic noise removed therefrom;

(d) subtracting said averaged noise signal from said portion of said output signal of said magnetic sensor; and (e) repeating processings in steps (c) and (d) when said output signal of said magnetic sensor is obtained for every new cycle.

7. An apparatus for removing cyclic noise from an output signal from a magnetic sensor which apparatus removes cyclic noise caused by vibration of a refrigerator from said output signal from said magnetic sensor which is cooled by said refrigerator to an operable low temperature so as to obtain an object signal, said apparatus comprising;

noise template generating means for generating a template of said cyclic noise excluding said object signal for measurement and other noise by arithmetically averaging said output of said magnetic sensor for every integral fundamental period of noise caused by vibration of said refrigerator; and cyclic noise removing means for obtaining said object signal by subtracting said template from said output of said magnetic sensor.

8. An apparatus as set forth in claim 7, wherein said noise template generating means further includes phase matching means for matching phases of said output signal of said magnetic sensor when said output signal of said magnetic sensor is to be added.

9. An apparatus as set forth in claim 7, wherein said noise template generating means further includes means for obtaining data which is subtracted from an averaged object signal from said output signal of said magnetic sensor as data for generation of said template of said cyclic noise, when said object signal has periodicity.

10. An apparatus as set forth in claim 7, further comprising means for arithmetically averaging a signal obtained by said cyclic noise removing means when said object signal has periodicity.

11. An apparatus as set forth in claim 7, wherein said noise template generating means includes;

means for obtaining an arithmetically averaged signal by arithmetically averaging said output signal of said magnetic sensor using a waveform in synchronism with said object signal as a trigger signal, means for obtaining a difference signal by subtracting said arithmetically averaged signal from said output signal of said magnetic sensor, and means for obtaining an averaged noise signal by arithmetically averaging said difference signal for a predetermined number of cycles which are prior to and after a position of a portion which is to have cyclic noise removed therefrom of said output signal of said magnetic sensor.

12. An apparatus as set forth in claim 7, further comprising;

driving frequency controlling means for controlling a driving frequency of said refrigerator, frequency detection means for detecting a characteristic frequency of a signal which is an object of measurement, and instruction means for detecting that an absolute value of a difference frequency between said characteristic frequency of said signal which is an object of measurement and said driving frequency of said refrigerator is equal to or smaller than a predetermined threshold value, and for supplying a driving frequency varying command for enlarging said difference frequency to said driving frequency controlling means.

13. An apparatus for removing cyclic noise from an output signal from a magnetic sensor which apparatus removes cyclic noise caused by vibration of a refrigerator from said output signal from said magnetic sensor which is cooled by said refrigerator to an operable low temperature so as to obtain an object signal, said apparatus comprising;

first arithmetically averaging means for obtaining an arithmetically averaged signal by arithmetically averaging said object signal using said object signal as a trigger signal prior to starting measurement;

first subtracting means for obtaining a difference signal by performing actual measurement so as to obtain said output of said magnetic sensor, and by subtracting said arithmetically averaged signal from said output signal of said magnetic sensor;

second arithmetically averaging means for obtaining an averaged noise signal by arithmetically averaging said difference signal for a predetermined number of prior cycles, said prior cycles being determined with respect to a position corresponding to a portion of said output signal of said magnetic sensor, which portion is to have cyclic noise removed therefrom;

second subtracting means for subtracting said averaged noise signal from said portion of said output signal of said magnetic sensor; and repetition control means for operating said 14. An apparatus as set forth in claim 13, further comprising;

driving frequency controlling means for controlling a driving frequency of said refrigerator, frequency detection means for detecting a characteristic frequency of a signal which is an object of measurement, and instruction means for detecting that an absolute value of a difference frequency between said characteristic frequency of said signal which is an object of measurement and said driving frequency of said refrigerator is equal to or smaller than a predetermined threshold value, and for supplying a driving frequency varying command for enlarging said difference frequency to said driving frequency controlling means.

* * * * *